Nov. 8, 1960 M. P. MARCUS 2,959,775

BI-DIRECTIONAL DIODE TRANSLATOR

Filed Dec. 23, 1957 2 Sheets-Sheet 1

INVENTOR
MITCHELL P. MARCUS

BY

Francis V. Giolma

ATTORNEY

Nov. 8, 1960 M. P. MARCUS 2,959,775

BI-DIRECTIONAL DIODE TRANSLATOR

Filed Dec. 23, 1957 2 Sheets-Sheet 2

United States Patent Office 2,959,775

Patented Nov. 8, 1960

2,959,775

BI-DIRECTIONAL DIODE TRANSLATOR

Mitchell P. Marcus, Johnson City, N.Y., assignor to International Business Machines Corporation, New York, N.Y., a corporation of New York Filed Dec. 23, 1957, Ser. No. 704,637

4 Claims. (Cl. 340—347)

Figure 1:
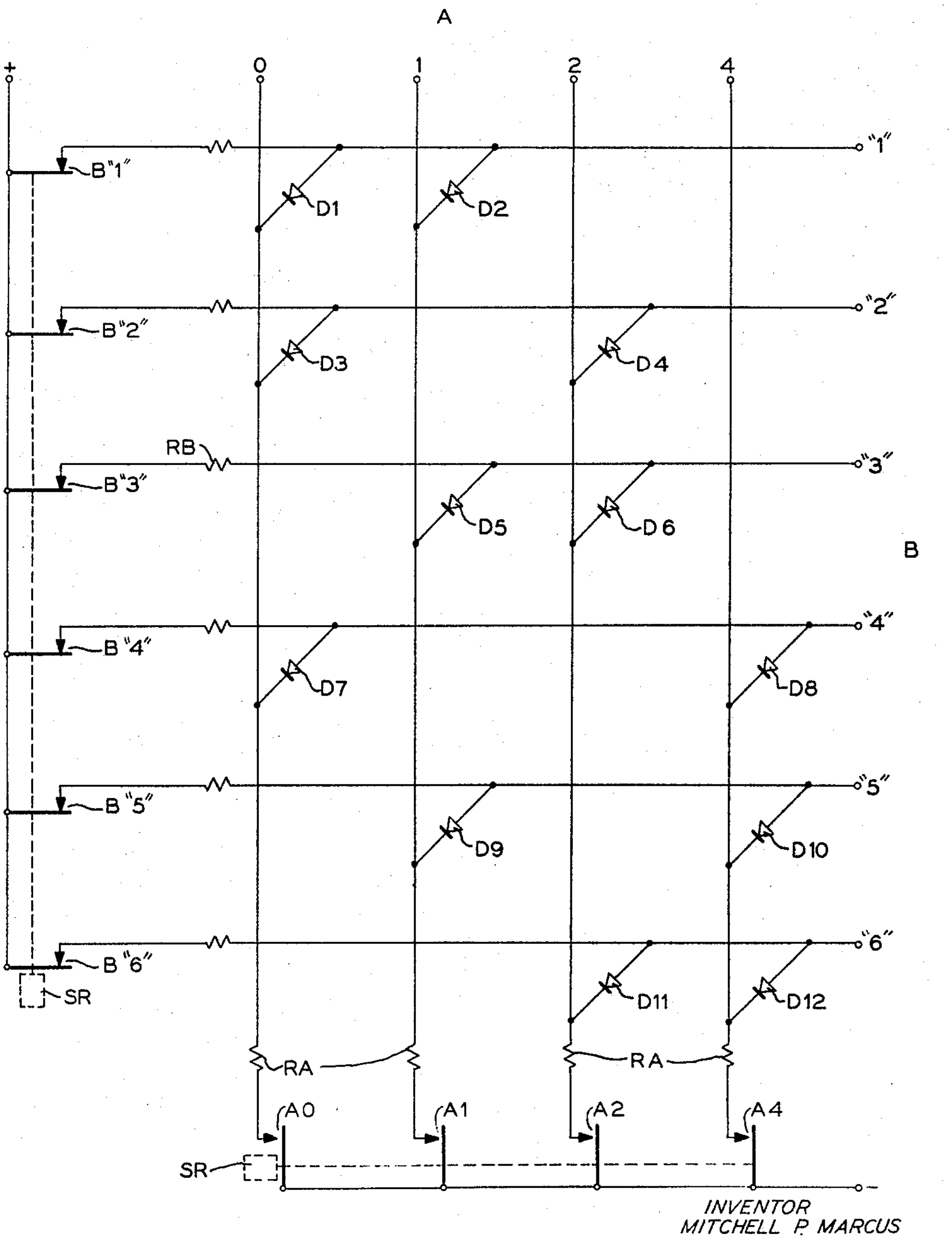

This invention relates generally to code translating circuits, and it has reference in particular to bi-directional code translating circuits.

Heretofore, when code translators have been used in computers and the like, diode translating matrices have been used, one to convert from a first code to a second code, and another one to reconvert from the second back to the first code, where necessary.

It is one object of this invention to provide a bi-directional diode code translating circuit.

Another object of the invention is to provide for utilizing with a single diode code translating circuit, switching means for selectively connecting the circuit for operation in different code translating directions.

It is also an object of the invention to provide in a diode code translator for utilizing a plurality of diodes in AND or OR arrangements, for translating from one code to another or vice versa.

Another object of the invention is to provide for using a fixed number of code translating diodes connecting the code lines of one code group to selected code lines of another code group, and for selectively switching load resistors for the two groups to provide for translation from a code of one group to that of the other or vice versa.

In accordance with a preferred embodiment of the invention, a plurality of code lines of a decimal code channel, for example, are connected to a corresponding plurality of code lines of a two-out-of-four code channel by diodes, which form AND circuits for the two-out-of-four to decimal conversion, and OR circuits for a conversion in the reverse direction. The different pluralities of code lines are selectively connected one at a time to opposite terminals of a direct current source through individual load resistors, by means of a common switching relay, which is operable to change the connections of the resistors to a source for converting from one code to the other or vice versa.

Other objects of the invention will be pointed out in the following description and claims, and illustrated in the accompanying drawings, which disclose, by way of examples, the principle of the invention and the best mode, which has been contemplated, of applying that principle.

Figure 2:
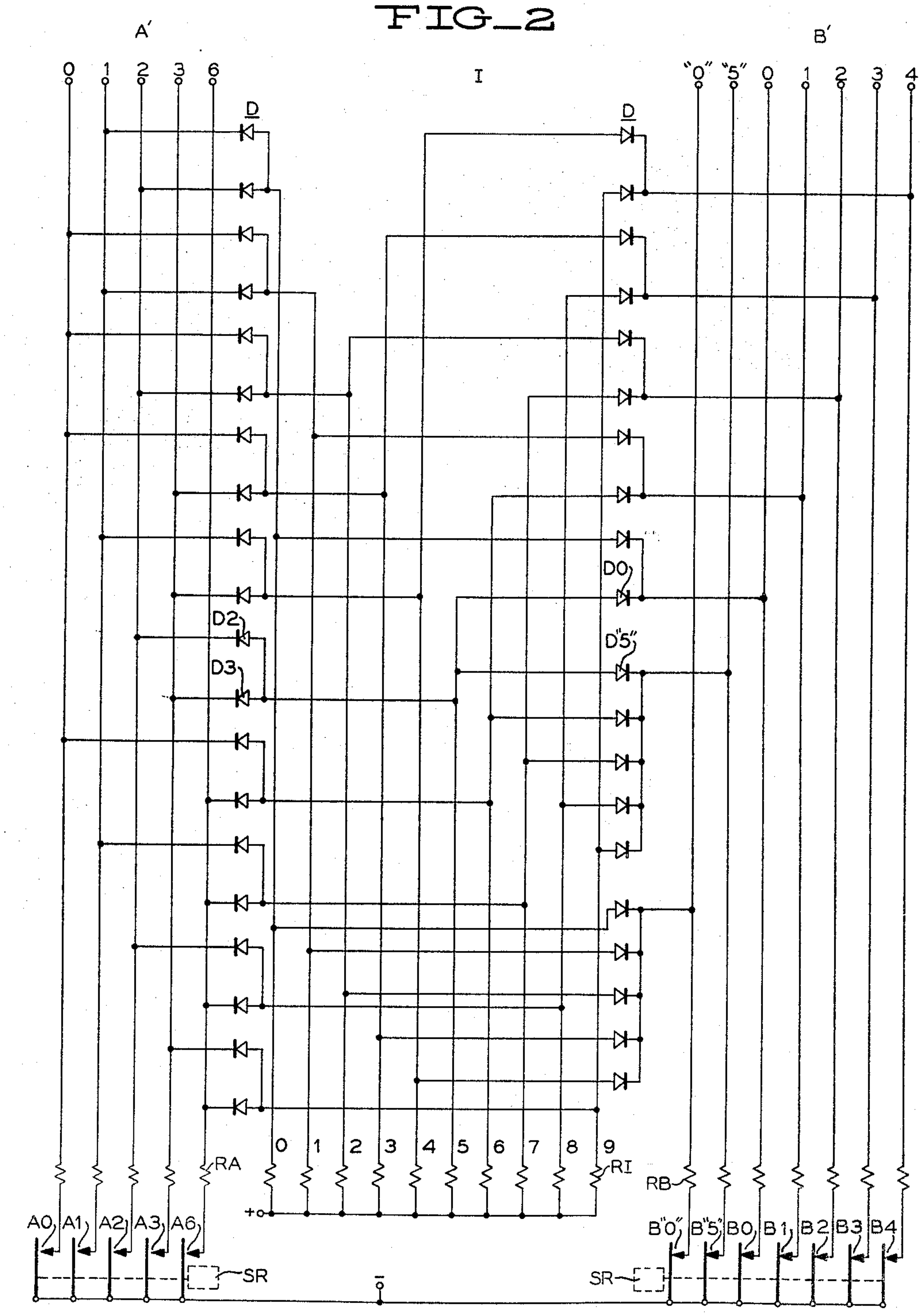

In the drawings:

Fig. 1 is a schematic diagram of a bi-directional diode code translator for translating between a two-out-of-four code and a decimal one-to-six code, and Fig. 2 is a schematic diagram of a bi-directional diode translator for converting between a two-out-of-five code and a bi-quinary code.

Referring to Fig. 1 of the drawings, it will be seen that the translating matrix comprises a group of code lines A having input-output terminals designated by the numerals 0, 1, 2 and 4, respectively, and which are disposed to carry the 0, 1, 2 and 4 code bits, respectively, when these bits are present in an associated two-out-of-four code. The translator always also includes another plurality of coordinate code lines of a group B, which are disposed to carry the code bits of a decimal 1 to 6 code, and which have input-output terminals designated by the respective bit numerals in quotation marks.

The code lines "1" through "6" are each connected to selected ones of the code line of group A by asymmetric conducting means or diodes, code line "1" being, for example, connected to code lines 0 and 1 of group A by diodes D1 and D2, respectively, which comprise an AND circuit. The code lines "2," "3," "4," "5" and "6" are likewise connected to corresponding code lines, line "2" being, for example, connected to the code lines 0 and 2 by diodes D3 and D4, each of the other code lines of the group B being similarly connected to the two corresponding code lines of group A.

The code lines 0, 1, 2 and 4 of group A are each provided with load resistors RA, through which the code lines are selectively disposed to be connected therethrough to the negative terminal of a direct current source through contacts A0, A1, etc., of a switching relay SR. Likewise, the code lines "1" through "6" are each provided with a load resistor RB and are disposed to be connected therethrough to the positive terminal of the direct current source, through contacts B1, etc., of the same switching relay SR. The A and B contacts of switching relay SR are arranged so that the code lines of either the A or the B groups are selectively connected to the source. The switching relay SR will be in the de-energized condition shown with the B contacts closed for conversion from a code of the A group to a code of the B group with the B lines connected to the source, and will be energized to open contacts B and close contacts A to connect the A lines to the source for a conversion from the B group code to the A group code.

The translating circuit is disposed to be used with code signals which vary between a relatively low or 0 output level, and a relatively high positive pulse level. With the switching relay in the position, as shown for conversion from an A code to a B code, the terminals 0, 1, 2 and 4 of the A group will be held at the low level when no signal is applied.

Under these conditions, the diodes D1 through D12 act as a short circuit connecting terminals "1," "2," "3," "4," "5," and "6" of the B group of code lines to terminals 0 through 4 and maintain the terminals "1" through "6" of the B code lines at the low level of terminals 0 through 4 so that no signal is present thereon. For example, code line "3" of group B is connected by diodes D5 and D6 to lines 1 and 2 of group A, both providing for maintaining the terminal 3 at the low level.

Should, however, signal pulses of a relatively high or positive polarity be applied to both the code lines 1 and 2 of group A, this causes a restricting or blocking action at diodes D5 and D6, and raises their voltage level so that said terminal "3" of line 3 of group B will be raised to the level of the positive signal, and an output signal will be indicated. If a signal is applied to only one conductor of group A, such as conductor 1, no signal appears on any B group line, as each of "1," "3" and "5" are held at the low level by diodes D1, D6 and D10, respectively.

For conversion from a group B code to a group A code, the switching relay SR is energized to close its normally-open A contacts and open the normally-closed B contacts. Under this condition, the diodes D1 through D12 form parts of OR circuits. Without any signal applied to the B code lines, the terminals 0, 1, 2 and 4 of group A are held at the low signal level of the B lines. Should a positive signal be applied, for example, to line "3" of group B, the diodes D5 and D6, which with diodes D2, D9 and D4, D11, provide OR circuits, furnish paths to both the lines 1 and 2 of group A, so that the positive signal appears at the output at terminals 1 and 2 of group A.

Referring to Fig. 2 of the drawings, it will be seen that a group of A′ coordinate code lines 0, 1, 2, 3 and 6 are likewise provided with load resistors RA and are disposed to be selectively connected therethrough to the negative terminal of a direct current source through contacts A0 through A6 of a switching relay SR. These lines comprise the code lines of a two-out-of-five code. Associated with the A′ group of code lines is a group B′ of code lines for a bi-quinary code including code lines "0," "5," 0, 1, 2, 3 and 4. These code lines are similarly connected through load resistors RB and the normally-closed contacts B"0" of B"5" and B0 through B4 of the switching relay SR to the negative terminal of the source.

One way to provide for switching from the A′ group code to the B′ group code is to utilize an intermediate group of coordinate code lines I, which are connected through load resistors RI to the positive terminal of the direct current source, and comprise the 0 through 9 code lines of a decimal code circuit. Each of the decimal code lines is terminally connected through a diode D to the corresponding 2 code lines of the A′ group code, line 5 of the decimal group, for example, being connected through diodes D2 and D3 to the code lines 2 and 3 of the A′ group. Code line 5 of the intermediate or decimal group is likewise connected through diodes D"5" and D0 to the corresponding code lines of the B′ group, being, for example, connected to the "5" and 0 code lines.

With the circuit as shown with contacts B"0" through B4 closed and A0 through A6 opened and no signals at the A′ inputs, the diodes of the A′ group conduct and circuits are provided through the resistors RI of the intermediate group and through their respective diodes D to the corresponding lines of the B′ group so that a maximum voltage drop exists across the load resistors RI, and the terminals of the B′ group are maintained at the low output level of the A′ group. Should a 5 signal be transmitted from the A′ group, code lines 2 and 3 would both be energized by positive pulses applied thereto. When positive signals are applied to these code lines, the diodes D2 and D3 provide a restricting or partial blocking action, and since no other diode is in parallel therewith, their voltage level is raised to that of the signal. Accordingly, the voltage level of the corresponding bi-quinary lines "5" and 0, connected thereto through the diodes D"5" and D0, will be raised, and "5" and 0 signals will be provided at the terminals of the B′ group. The diodes D2 and D3 operate as an AND circuit, and D"5" and D0 operate as parts of OR circuits.

With the switching relay SR operated to the opposite position with contacts B opened and contacts A closed, conversion may be made from the B′ group code to the A′ group code. With terminals "0," "5" and 0 through 4 of the B′ group maintained at a 0 or a relatively low voltage level, diodes D to the code lines of the B′ group operate as a low impedance connection or short circuit, thus maintaining the intermediate conductors of group I and the conductors of the A′ group at the relatively low voltage level of terminals "0," "5" and 0 through 4 due to the drop in the load resistors RI.

Upon the occurrence at the B′ terminals of a 5 signal, for example, the "5" and 0 code lines of the B′ group receive positive pulses, and the diodes such as D0 and D"5," as well as the others connected thereto, are partially blocked or restricted. It will be noted that the conductors 5, 6, 7, 8 and 9 of the intermediate group I are connected to conductor "5" of the B′ group, but it will likewise be noted that conductors 5, 6, 7, 8 and 9 also have other parallel paths to other conductors of the B′ group which do not carry signals so that the application of a positive pulse to the terminal "5" of the B′ group does not alone affect the flow of current through the load resistors of these intermediate conductors. However, the voltage level of conductor 5 of the intermediate group is raised to the signal level, since B′ input 0 is also energized, and since this conductor is connected through diodes D2 and D3 to conductors 2 and 3 of the A′ group, an output signal will appear upon these conductors, providing a conversion from the B′ group code to the A′ group code. The diodes D2 and D3 thus form parts of OR circuits, while diodes D"5" and D0 operate as AND circuits.

From the above description and the accompanying drawings, it will be seen that I have provided in a simple and effective manner for utilizing a single diode matrix for translating from one code to another or vice versa. A code translator embodying the principles of this invention is simple and inexpensive to manufacture and provides highly satisfactory performance in both directions.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. A reversible direction code translating matrix comprising, a first group of code lines having input-output terminals at one end and load terminals at the other end, a second group of code lines having input-output terminals at one end and load terminals at the other end, said lines being disposed to carry an electrical signal when a corresponding code element is present, impedance means connected to said other ends, a common switch means selectively operable to connect the impedance means of one of the groups to a source of direct current and disconnect the impedance means of the other group therefrom, and asymmetric conducting means connecting each of the lines of one group to selected ones of the lines of the other group so as to provide a noninverted output signal on select lines of one group in response to signals on select lines of the other group.

2. A bi-directional code translating matrix comprising, a first group of code lines each having an input-output terminal, a second group of code lines each having an input-output terminal, and an intermediate group of code lines, impedance means connecting the intermediate group to one terminal of a direct current source, impedance means connected to the first and second groups of lines, a single switch means operable to selectively connect the impedance means of one of the first and second group to the other terminal of the source, and disconnect the impedance means of the other of the first and second group therefrom, and asymmetric conducting means connecting each of the intermediate group lines to selected ones of the first and second group lines so as to provide a noninverted signal at the input-output terminals of select ones of the lines of one of the first and second groups in response to signals on the input-output terminals of select ones of the other of said first and second groups.

3. In a bi-directional signal translating device, a first and second groups of signal lines adapted to carry electrical signals of a given polarity in different code arrangements, a single switch means for selectively connecting one or the other of the groups of lines to a direct current source, input-output terminals for each of the lines, and asymmetric conducting means connecting each of the lines of one group to selected lines of the other group to provide AND circuits from one group to the other and OR circuits in the opposite direction for producing output signals of one polarity on select ones of the lines of one group in response to input signals of the same polarity on select ones of the other group.

4. In a bi-directional code translating matrix for translating a first code having combinations of first code elements to a second code having combinations of second code elements and vice versa, a matrix of first and second groups of coordinate lines, the lines in said first group corresponding to the elements of said first code and the lines of the second group corresponding to the elements of said second code, corresponding ones of each of said lines disposed to carry an electrical signal of one polarity when the corresponding code element is present in the associated code, a plurality of asymmetric conducting means connecting each of the lines in one group to selected lines in the other group, and means including a common switch device and impedance means individual to the lines for connecting all the lines of one group or the other to a source of direct current so as to impress on select ones of the lines of the other group an output signal of the same polarity as is impressed on select ones of said one group.

References Cited in the file of this patent

UNITED STATES PATENTS

| | | |
|---|---|---|
| 2,473,444 | Rajchman | June 14, 1949 |
| 2,655,625 | Burton | Oct. 13, 1953 |